US010241147B2

(12) United States Patent
Lamesch

(10) Patent No.: US 10,241,147 B2
(45) Date of Patent: Mar. 26, 2019

(54) LOW-COST COMPLEX IMPEDANCE MEASUREMENT CIRCUIT

(71) Applicant: IEE International Electronics & Engineering S.A., Echternach (LU)

(72) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 8 days.

(21) Appl. No.: 15/525,015

(22) PCT Filed: Nov. 4, 2015

(86) PCT No.: PCT/EP2015/075743
§ 371 (c)(1),
(2) Date: May 5, 2017

(87) PCT Pub. No.: WO2016/071416
PCT Pub. Date: May 12, 2016

(65) Prior Publication Data
US 2017/0336469 A1    Nov. 23, 2017

(30) Foreign Application Priority Data

Nov. 5, 2014 (LU) .......................................... 92591

(51) Int. Cl.
*G01R 27/28* (2006.01)
*G01R 31/28* (2006.01)
(Continued)

(52) U.S. Cl.
CPC ..... *G01R 31/2829* (2013.01); *G01R 27/2605* (2013.01); *B60R 21/01532* (2014.10)

(58) Field of Classification Search
CPC ............ G01R 31/2829; G01R 27/2605; G01R 27/2623; G01R 27/228; G01D 5/24; G01D 5/2417; H03K 17/955
See application file for complete search history.

(56) References Cited

U.S. PATENT DOCUMENTS 4,093,915 A * 6/1978 Briefer ............... G01R 27/2605
324/603
6,366,099 B1 * 4/2002 Reddi ................ G01R 27/2605
324/658

(Continued)

FOREIGN PATENT DOCUMENTS

JP      H1178655 A      3/1999
JP      2004219159 A    8/2004
WO      WO2014116780 A1 7/2014

OTHER PUBLICATIONS

J. Smith et al., Electric field sensing for graphical interfaces, IEEE Comput. Graph. Appl., 18(3): 1998, pp. 54-60.

(Continued)

*Primary Examiner* — Minh N Tang
(74) *Attorney, Agent, or Firm* — Reising Ethington P.C.

(57) ABSTRACT

A method and circuit for measuring impedance of a sense-only capacitive sensor operated in loading mode. The method carried out by the circuit includes the steps of: combining a plurality of synchronized output signals; applying low-pass filtering to the summed output signals to generate a sinusoidal test signal; applying the sinusoidal test signal to a sensor signal voltage divider circuit and to a reference voltage divider circuit; determining amplitude and relative phase, with respect to the sinusoidal test signal, of a sensor voltage signal and a reference voltage signal; obtaining a difference voltage signal by subtracting the reference voltage signal from the sensor voltage signal; and feeding the difference voltage signal to a vector demodulator unit for obtaining a real part and an imaginary part of the complex impedance of the capacitive sensor.

14 Claims, 5 Drawing Sheets

(51) Int. Cl.
   *G01R 27/26*   (2006.01)
   *B60R 21/015*   (2006.01)

(56) References Cited

U.S. PATENT DOCUMENTS

| | | |
|---|---|---|
| 8,219,331 B2 | 7/2012 | Gulba et al. |
| 2002/0038947 A1 | 4/2002 | Baba et al. |

OTHER PUBLICATIONS

International Search Report for International application No. PCT/EP2015/075743, dated Feb. 4, 2016, 3 pages.
Written Opinion for International application No. PCT/EP2015/075743, dated Feb. 4, 2016, 5 pages.

* cited by examiner

LOW-COST COMPLEX IMPEDANCE MEASUREMENT CIRCUIT

TECHNICAL FIELD

The invention relates to a complex impedance measurement circuit for a sense-only capacitive sensor operated in loading mode, in particular for vehicle applications, a method of measuring impedance of such capacitive sensor and a software module for carrying out the method.

BACKGROUND ART

Vehicle capacitive detection systems comprising sense-only capacitive sensors, operated in loading mode, are nowadays widely used, for instance for detection of vehicle seat occupancy.

For example, document JP-H11-78655 describes a vehicle seat occupancy detecting apparatus including electric field sensors. A high frequency oscillator whose frequency is about 100 kHz is connected via a resistor to an antenna electrode arranged on an automobile seat. By this, a differential AC electric field is generated between the antenna electrode and the automobile ground, so that a load current corresponding to the AC electric field flows through the resistor. The AC load current is converted by the resistor into an AC voltage which is then transmitted by a voltage buffer to a detector including a bandpass filtering function which generates a DC output voltage.

If an occupant is seated on the seat, the current flowing between the antenna electrode and the automobile ground is increased, indicating the presence of the occupant on the seat.

An occupant detecting apparatus for detecting an occupant seated on the passenger seat of a vehicle is described in US application 2002/0038947. The occupant detecting apparatus comprises a plurality of electric field sensors provided in a bottom part and a rear part of the seat, and also a load sensor and an acceleration sensor. The electric field sensors are connected to a control unit comprising a high frequency oscillator, a resistor, a voltage buffer and a detector. Antenna electrodes are selected by the selectors and connected between the resistor and a voltage buffer. An analog-to-digital converter performs an analog-to-digital conversion on output signals of the selected electric field sensors. Digital output signals of the electric field sensors, the node sensor and the acceleration sensor are connected to a central processing unit, which determines a seat occupancy based on the sensor output signals, following predetermined criteria.

SUMMARY

It is desirable to provide a low-cost method of measuring impedance of a sense-only capacitive sensor operated in loading mode that complies with automotive electromagnetic compatibility (EMC) requirements.

It is therefore an object of the invention to provide a method of measuring impedance of a sense-only capacitive sensor operated in loading mode employing less hardware parts and/or low-cost hardware parts, but still meeting automotive EMC requirements.

The term "vehicle", as used in this application, shall particularly be understood to encompass passenger cars, trucks and buses and the like.

In one aspect of the present invention, the object is achieved by a method of measuring impedance of a sense-only capacitive sensor operated in loading mode, particularly in a vehicle application.

The method comprises the following steps:

combining a plurality of synchronized output signals having a test signal frequency, the plurality of synchronized output signals being generated by at least one pulse width modulation unit, by summing the synchronized output signals, applying low-pass filtering to the summed output signals to generate a sinusoidal test signal of test signal frequency;

applying the sinusoidal test signal to a sensor signal voltage divider circuit comprising at least one impedance member and at least one capacitor connected in series, and a capacitive sensor having a complex impedance which at the test signal frequency is electrically connected in parallel to the at least one capacitor;

determining amplitude and relative phase, with respect to the sinusoidal test signal, of a sensor voltage signal that is indicative of the complex impedance of the capacitive sensor;

applying the sinusoidal test signal to a reference voltage divider circuit that is substantially identical to the sensor signal voltage divider circuit except for the absence of a capacitive sensor;

determining amplitude and relative phase, with respect to the sinusoidal test signal, of a reference voltage signal that is indicative of a complex impedance of the reference voltage divider circuit;

obtaining a difference voltage signal by subtracting the reference voltage signal from the sensor voltage signal; and feeding the difference voltage signal to a vector demodulator unit for obtaining a real part and an imaginary part of the complex impedance of the capacitive sensor.

The term "loading mode", as used in this application, shall be understood particularly as a mode of measuring a displacement current caused by the presence of a grounded object in proximity of a single transmitting electrode (cf. J. Smith et al., Electric field sensing for graphical interfaces, IEEE Comput. Graph. Appl., 18(3):54-60, 1998).

The term "vector demodulator unit", as used in this application, shall be understood particularly as a demodulator that is configured to recover, relative to a local oscillator, the in-phase component and the quadrature component from a composite input signal. Vector demodulation means are commonly known in the art of sensor signal processing and therefore need not be described in detail herein.

One advantage of the method described herein lies in that interfering effects like temperature drift can substantially be eliminated by exploiting the difference voltage signal between voltage signals from two identical divider circuits. In this context, it will be noted that both said reference voltage signal and said sensor voltage signal are individually evaluated and the respective amplitude and relative phase are individually determined in the microcontroller prior to the subtracting of the sampled values signal values. In fact, both the sensor voltage signal and the reference voltage signal are individually sampled in an ADC converter and the resulting sampled values are subtracted in order to obtain the difference voltage signal.

Another advantage of the method described herein lies in that the influence of the at least one capacitor in each identical divider circuits, serving as suppression means for electromagnetic interference, can be substantially suppressed.

Also, in a suitable embodiment the impedance of the capacitive sensor can be determined with little hardware effort.

Preferably, the sinusoidal test signal is applied to the sensor signal voltage divider circuit and the reference voltage divider circuit at the same time. Also preferably, the steps of determining amplitude and relative phase of the sensor voltage signal and the reference voltage signal, respectively, are carried out simultaneously or in close proximity in time. The term "in close proximity in time", as used in this application, shall be understood particularly such that any time interval that may exist between the two time periods of executing the steps of determining amplitude and relative phase is smaller than any one of the two time periods.

In a preferred embodiment, the test signal frequency lies in a range between 10 kHz and 500 kHz. In this frequency range, hardware components for carrying out the method are inexpensive and easy available.

In another preferred embodiment, the step of determining amplitude and relative phase of the sensor voltage signal includes converting the sensor voltage signal by a first analog-digital-converter into a sampled sensor voltage signal, and the step of determining amplitude and relative phase of the reference voltage signal includes converting the reference voltage signal by a second analog-digital-converter into a sampled reference voltage signal. In this way, the numerous tools of digital signal processing can advantageously be applied.

In yet another preferred embodiment, the step of determining amplitude and relative phase of the sensor voltage signal and the step of determining amplitude and relative phase of the reference voltage signal comprise employing an equivalent time sampling method in order to generate the respective sampled voltage signals. The term "equivalent time sampling method", as used in this application, shall particularly be understood as a sampling method in which only an instantaneous input signal is measured at the sampling instant and the input signal is only sampled once per trigger. In the subsequent sampling trigger, a small timely delay is added and another sample is taken. The intended number of samples determines the resulting number of cycles needed to reproduce the input signal.

In this way, requirements on hardware properties, particularly regarding speed of signal handling and processing, can be a lowered, which results in lower hardware costs.

In one embodiment, the equivalent time sampling method is carried out by a microcontroller and includes employing an incremental time delay between subsequent samples that is equal to one clock period of the microcontroller. In this way, the impedance measurement can be carried out with sufficient precision in a sufficiently short time period with low-cost hardware.

In one embodiment, in a preceding step of the method, there is provided
  at least one radio frequency choke electrically connected in series between the capacitive sensor and the series connection of the at least one impedance member and the at least one capacitor of the sensor signal voltage divider circuit, and
  at least one additional capacitor that is electrically connected in parallel to the capacitive sensor,
  at least one radio frequency choke that is substantially identical to the radio frequency choke of the sensor signal voltage divider circuit, and that is electrically connected in series to at least one additional capacitor that is substantially identical to the additional capacitor of the sensor signal voltage divider circuit, the at least one radio frequency choke and the at least one capacitor connected in parallel to the at least one capacitor of the reference voltage divider circuit, for suppressing electromagnetic interference (EMI).

By exploiting the fact that the reference voltage divider circuit is identical to the sensor signal voltage divider circuit, the influence of the additional EMI suppression components can be reduced.

In another preferred embodiment, in a preceding step of the method, there is provided a reference impedance whose impedance is a priori known, and which can be transferred between a state of being electrically connected in parallel to the capacitive sensor and a state of being disconnected from the sensor signal voltage divider circuit via a remotely-controlled switch. The step of applying the sinusoidal test signal to the sensor signal voltage divider circuit comprises applying the sinusoidal test signal with the reference impedance being electrically connected in parallel to the capacitive sensor, and applying the sinusoidal test signal with the reference impedance being electrically disconnected from the sensor signal voltage divider circuit.

Further, the step of determining amplitude and relative phase of the sensor voltage signal comprises, in addition to determining amplitude and relative phase of the sensor voltage signal with the reference impedance being electrically disconnected from the sensor signal voltage divider circuit, determining amplitude and relative phase of a second sensor voltage signal with the reference impedance being electrically connected in parallel to the capacitive sensor.

The step of obtaining a difference voltage signal includes obtaining the difference voltage signal by subtracting the sampled reference voltage signal from the sampled sensor voltage signal and, in addition, obtaining a second difference voltage signal by subtracting the sampled reference voltage signal from the second sampled sensor voltage signal. The step of feeding the difference voltage signal to the vector demodulator unit is carried out subsequently for the difference voltage signal and the second difference voltage signal.

As the reference impedance is known a priori and the impedance of reference impedance has been determined by measurement, the transfer function of the sensor signal voltage divider circuit can be calculated, and the measured complex impedance of the capacitive sensor can be corrected by the calculated transfer function, by that improving the precision of the measurement.

In yet another preferred embodiment, in a preceding step of the method, there is provided, alternatively or additionally, a reference impedance whose impedance is a priori known, and which can be transferred between a state of being electrically connected in parallel to the at least one capacitor of the reference voltage divider circuit and a state of being disconnected from the reference voltage divider circuit via a remotely-controlled switch.

The step of applying the sinusoidal test signal to the reference voltage divider circuit comprises applying the sinusoidal test signal with the reference impedance being electrically connected in parallel to the at least one capacitor of the reference voltage divider circuit, and applying the sinusoidal test signal to the reference voltage divider circuit with the reference impedance being electrically disconnected from the reference voltage divider circuit.

The step of determining amplitude and relative phase of the reference voltage signal comprises, in addition to determining amplitude and relative phase of the reference voltage signal with the reference impedance being electrically disconnected from the reference voltage divider circuit, determining amplitude and relative phase of a third reference voltage signal with the reference impedance being electrically connected in parallel to the at least one capacitor of the reference voltage divider circuit.

The step of obtaining a difference voltage signal includes obtaining the difference voltage signal by subtracting the sampled reference voltage signal from the sampled sensor voltage signal and, in addition, obtaining a third difference voltage signal by subtracting the third sampled reference voltage signal from the sampled sensor voltage signal.

The step of feeding the difference voltage signal to the vector demodulator unit is carried out subsequently for the difference voltage signal and the third difference voltage signal.

Again, as the reference impedance is known a priori and the impedance of the reference impedance has been determined by measurement, the transfer function of the reference voltage divider circuit can be calculated, and the measured complex impedance of the capacitive sensor can be corrected by the calculated transfer function, by that improving the precision of the measurement.

In another aspect of the invention, an impedance measurement circuit for determining a complex impedance of a capacitive sensor operated in loading mode is provided.

The impedance measurement circuit comprises a microcontroller that includes a processor unit, a digital memory unit, a microcontroller system clock, a plurality of synchronized pulse width modulation units and an analog-to-digital converter unit. Such equipped microcontrollers are commercially available nowadays in many variations.

The impedance measurement circuit further comprises a pulse generator unit that is configured to weight and to sum output signals of the plurality of synchronized pulse width modulation units, said output signals having the same test signal frequency and said output signals exhibiting a defined relative phase shift between each other, and a low-pass filter unit that is connected in series to an output of the pulse generator unit and that is configured to filter the summed output signals for generating a sinusoidal test signal having the test signal frequency.

Moreover, the impedance measurement circuit includes a sensor signal voltage divider circuit that is connected in series to the low-pass filter unit and includes at least one impedance member and at least one capacitor connected in series. The at least one capacitor is connectable to the capacitive sensor having a complex impedance. The capacitive sensor is, in a connected state, electrically connected in parallel to the at least one capacitor at the test signal frequency, and the sensor signal voltage divider circuit is connected to a first input port of the analog-to-digital converter unit.

The term "impedance member", as used in this application, shall be understood particularly to encompass ohmic resistors, capacitors, inductors or any arbitrary combination of those.

Then, the impedance measurement circuit comprises a reference voltage divider circuit that is connected in series to the low-pass filter unit and is substantially identical to the sensor signal voltage divider circuit except for the absence of connections to the capacitive sensor. The reference voltage divider circuit is connected to a second input port of the analog-to-digital converter unit.

Moreover, the impedance measurement circuit comprises a vector demodulator unit including a quadrature detector, configured for separating an in-phase component and a quadrature component of a signal with regard to a reference signal.

The processor unit is configured to at least carry out steps of any embodiment of the method disclosed herein. In this way, the impedance of the capacitive sensor can be determined in a fast, reliable and reproducible way, and method steps can readily be modified if required.

In one embodiment, the microcontroller further comprises a multiplexer and the analog-to-digital converter unit includes a single analog-to-digital converter, wherein the multiplexer is configured, controlled by the processor unit, to switch the first or the second input port of the analog-to-digital converter unit to an input port of the single analog-to-digital converter. By that, hardware costs can further be reduced.

In another embodiment, the impedance measurement circuit further comprises at least one radio frequency choke that is electrically connected in series between the capacitive sensor and the series connection of the at least one impedance member and the at least one capacitor of the sensor signal voltage divider circuit, and at least one additional capacitor that is electrically connected in parallel to the capacitive sensor.

The impedance measurement circuit further includes at least another radio frequency choke that is substantially identical to the radio frequency choke of the sensor signal voltage divider circuit, and that is electrically connected in series to at least one additional capacitor that is substantially identical to the additional capacitor of the sensor signal voltage divider circuit. The at least one radio frequency choke and the at least one additional capacitor are connected in parallel to the at least one capacitor of the reference voltage divider circuit.

By employing the radio frequency chokes, electromagnetic interference can further be suppressed, while effects on the determination of the complex impedance of the capacitive sensor can be kept to a minimum or can even be eliminated due to the identical design of the sensor signal voltage divider circuit and the reference voltage to the circuit.

In an alternative embodiment, the impedance measurement circuit further comprises a reference impedance whose impedance is a priori known, and which can be transferred between a state of being electrically connected in parallel to the capacitive sensor and a state of being disconnected from the sensor signal voltage divider circuit via a remotely-controlled switch.

As described before, employing a reference impedance can allow to calculate the transfer function of the sensor signal voltage divider circuit, and the measured complex impedance of the capacitive sensor can be corrected by the calculated transfer function, whereby the precision of the measurement can be improved.

In another embodiment, the impedance measurement circuit alternatively or additionally comprises a reference impedance whose impedance is a priori known, and which can be transferred between a state of being electrically connected in parallel to the at least one capacitor of the reference voltage divider circuit and a state of being disconnected from the reference voltage divider circuit via a remotely-controlled switch.

As described before, employing a reference impedance can allow to calculate the transfer function of the reference voltage divider circuit, and the measured complex impedance of the capacitive sensor can be corrected by the calculated transfer function. In this way, the precision of the measurement can be improved.

In yet another aspect of the present invention, a software module is provided for carrying out steps of any embodiment of the disclosed method of measuring the impedance of the sense-only capacitive sensor operated in loading mode. The method steps to be conducted are converted into a program code of the software module, wherein the program code is implementable in the digital memory unit of the microcontroller and is executable by the processor unit of the microcontroller.

The software module can enable a robust and reliable execution of the method and can allow for a fast modification of method steps.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of several not limiting embodiments with reference to the attached drawings, in which.

DETAILED DESCRIPTION

In the following, several embodiments in accordance with the invention are disclosed. The individual embodiments are described with reference to a particular figure and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, the description of a preceding embodiment should be referred to.

Figure 1:
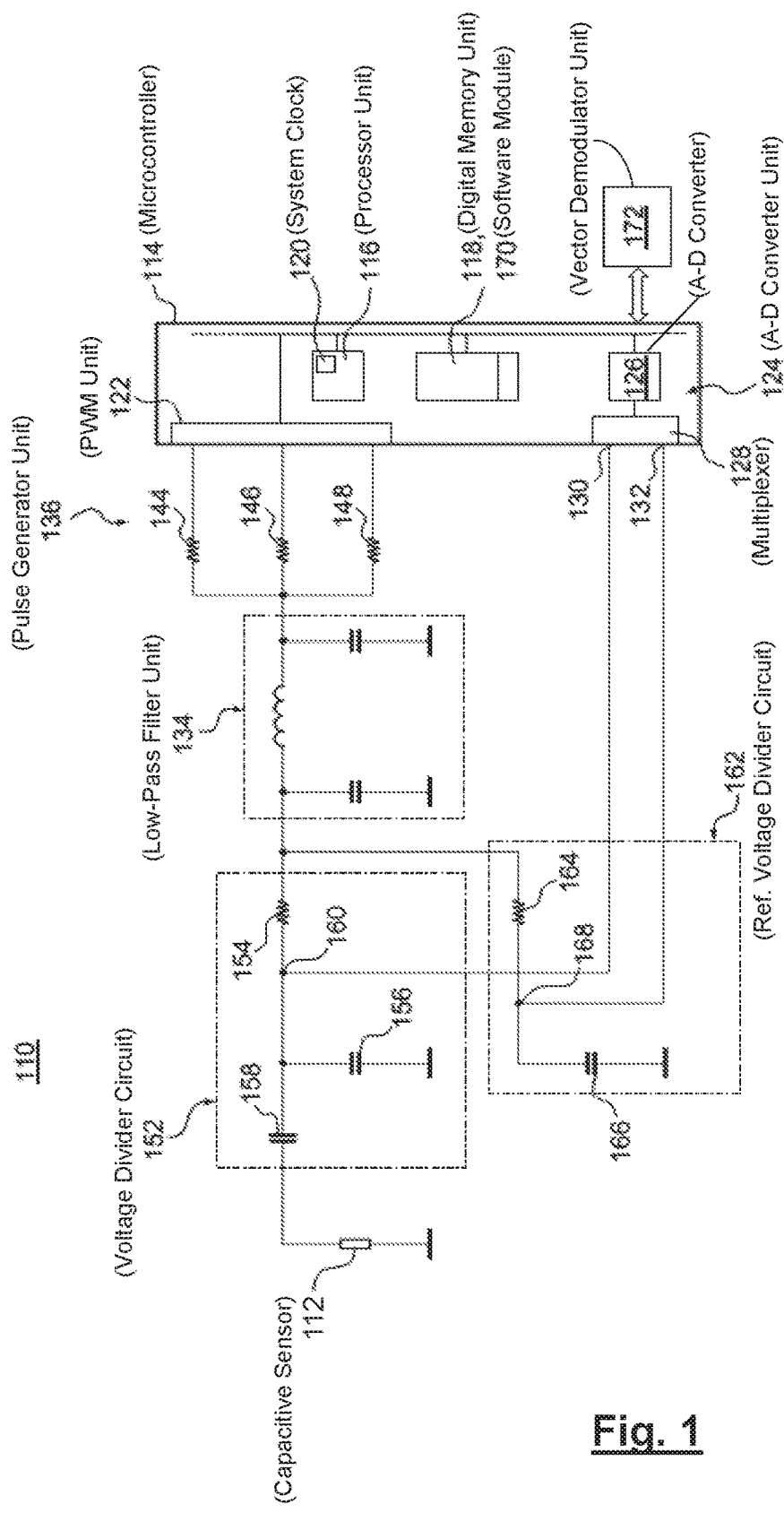
FIG. 1 shows a layout of an embodiment of an impedance measurement circuit in accordance with the invention.

FIG. 1 shows a layout of an embodiment of an impedance measurement circuit 110 for determining a complex impedance of a capacitive sensor operated in loading mode, in accordance with the invention.

The impedance measurement circuit 110 comprises a microcontroller 114 that includes a processor unit 116, a digital memory unit 118, a microcontroller system clock 120, a plurality of e.g. three synchronized pulse width modulation (PWM) units 122 with square wave outputs and an analog-to-digital converter unit 124. It is understood that data links (indicated in FIG. 1 as a data bus) exist that mutually connect the various components of the microcontroller 114.

The impedance measurement circuit 110 further comprises a pulse generator unit 136 that is configured to weight and to sum output signals 138, 140, 142 of the plurality of synchronized PWM units 122 having one test signal frequency. The adjustable test signal frequency generally lies in a range between 10 kHz and 500 kHz, and is selected in this specific embodiment to be 100 kHz.

The pulse generator unit 136 comprises three resistors 144, 146, 148, each resistor 144, 146, 148 being connected to an output port of one of the three PWM units 122, for weighted summing of all the PWM unit output signals 138, 140, 142.

Figure 2:
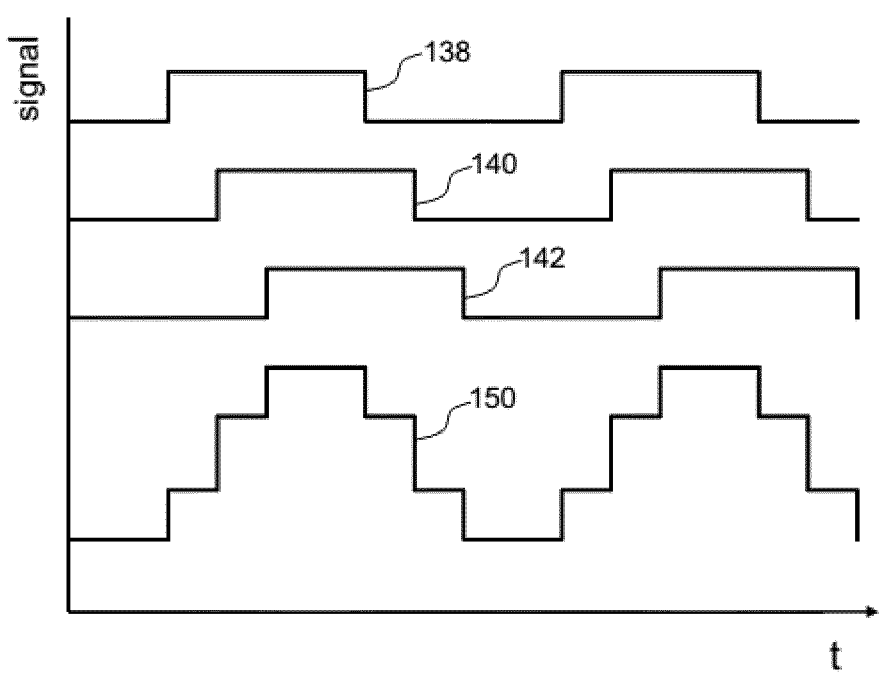
FIG. 2 shows a combination of a plurality of synchronized output signals of same test signal frequency, generated by synchronized pulse width modulation units of the microcontroller of the impedance measurement circuit pursuant to FIG. 1.

The square wave output signals 138, 140, 142 of the pulse width modulation units 122 are schematically shown in FIG. 2. The output signals 138, 140, 142 have the same test signal frequency, with a defined relative phase shift among them. PWM unit output signal 140 is delayed by ⅛ period relative to PWM unit output 138, and PWM unit output signal 142 in turn is delayed by ⅛ period relative to PWM unit output signal 140. The relative amplitudes of the PWM unit output signals 138, 140, 142 as weighted by the resistors are 1, $\sqrt{2}$ and 1, respectively. By summing the weighted PWM unit output signals 138, 140, 142, an approximated sine wave 150 is generated as indicated in the bottom part of FIG. 2. The 2nd to 7th harmonics of the approximated sine wave 150 are substantially suppressed.

The low pass filter unit 134, designed as an LC-filter in π-configuration, is connected in series to the output of the pulse generator unit 136 and substantially filters out most of the remaining harmonics. The output of the low pass filter unit 134 is a sinusoidal test signal having a frequency of 100 kHz and a low distortion factor.

The impedance measurement circuit 110 further includes a sensor signal voltage divider circuit 152 and a reference voltage divider circuit 162. Both the sensor signal voltage divider circuit 152 and the reference voltage divider circuit 162 are connected in series to the low-pass filter unit 134.

The sensor signal voltage divider circuit 152 includes an impedance member 154 formed by a resistor, which is the upper leg of the sensor signal voltage divider circuit 152, and a capacitor 156 connected in series, which is the lower leg of the sensor signal voltage divider circuit 152. A capacitance value of the capacitor 156 is selected such that substantially all of potentially externally injected high frequency currents, for instance being injected during a BCI (bulk current injection) into the sensor wiring, are deviated to ground and not into the sensor signal voltage divider circuit 152.

The capacitor 156 is connected to a sense-only capacitive sensor 112 operated in loading mode having a complex impedance which is to be measured and is a combination of resistive, capacitive and inductive impedances.

In the connected state shown in FIG. 1, the capacitor 156 is connected to the capacitive sensor 112 via an additional AC decoupling capacitor 158 for preventing injection of a DC voltage into the capacitive sensor 112. The AC decoupling capacitor 158 is selected to have, at the test signal frequency, an impedance whose modulus is much smaller than the modulus of any expected complex impedance of the capacitive sensor 112. In this way, the capacitive sensor 112 is effectively electrically connected in parallel to the capacitor 156 at the test signal frequency.

The reference voltage divider circuit 162 is identically designed to the sensor signal voltage divider circuit 152 except for the absence of connections to the capacitive sensor 112, and comprises an impedance member 164 formed as a resistor and a capacitor 166 connected in series and having same values as the resistor 154 and capacitor 156 of the sensor signal voltage divider circuit 152.

The analog-to-digital converter unit 124 comprises a single analog-to-digital converter 126 and a signal multiplexer 128, wherein the multiplexer 128 is configured, controlled by the processor unit 116, to switch input ports 130, 132 of a plurality of input ports (only two input ports shown in FIG. 1) of the analog-to-digital converter unit 124 to an input port of the single analog-to-digital converter 126. The analog-to-digital converter 126 is configured to be triggered by an additional clock source of the microcontroller 114, formed by another PWM unit (not shown).

The sensor signal voltage divider circuit 152 is electrically connected at a circuit center point 160 to a first input port 130 of the analog-to digital converter unit 124. The reference voltage divider circuit 162 is electrically connected at a circuit center point 168 to a second input port 132 of the analog-to-digital converter unit 124.

Figure 5:
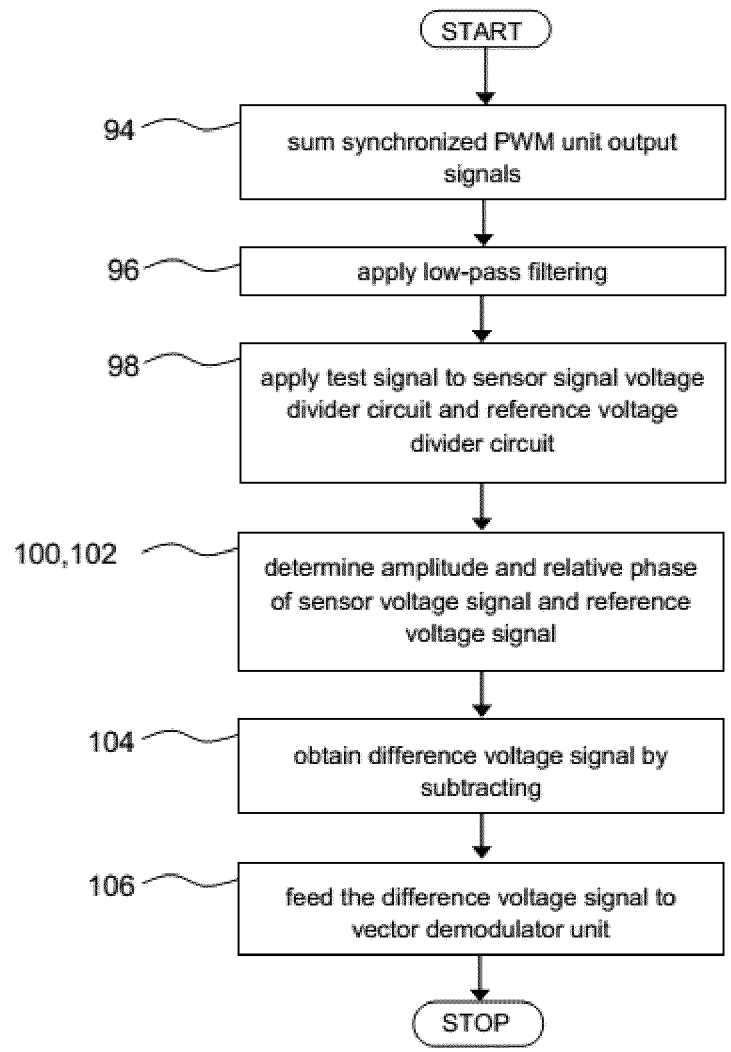
FIG. 5 is a flowchart of an embodiment of a method in accordance with the invention.

In the following, an embodiment of a method of measuring the impedance of the sense-only capacitive sensor 112 operated in loading mode is described (FIG. 5). In preparation of measuring the impedance of the capacitive sensor 112 by the embodiment of the impedance measurement circuit 110 pursuant to FIG. 1, it shall be understood that all involved units and devices are in an operational state and configured as illustrated in FIG. 1.

In order to be able to carry out the method, the microcontroller 114 comprises a software module 170. Method steps to be conducted are converted into a program code of the software module 170, wherein the program code is implementable in the digital memory unit 118 of the microcontroller 114 and is executable by the processor unit 116 of the microcontroller 114.

In one step 100 of the method, amplitude and relative phase, with respect to the sinusoidal test signal, of a sensor voltage signal obtained from the circuit center point 160 of the sensor signal voltage divider circuit 152, which is indicative of the complex impedance of the capacitive sensor 112, is determined.

In a similar way, amplitude and relative phase, with respect to the sinusoidal test signal, of a reference voltage signal obtained from the circuit center point 168 of the reference voltage divider circuit 162, which is indicative of a complex impedance of the reference voltage divider circuit 162, is determined in another step 102.

To this end, the multiplexer 128 subsequently switches the first input port 130 with the sensor voltage signal and the second input port 132 with the reference voltage signal, respectively, to the input port of the single analog-to-digital converter 126.

While either one of the sensor voltage signal and the reference voltage signal is connected to the input port of the single analog-to-digital converter 126, an equivalent time sampling method is employed as follows.

In order to sample the signals at the input port of the single analog-to-digital converter 126, a specified number of samples per period of the test signal frequency is required, preferably more than 100 samples per period, for achieving a sufficient precision of the impedance measurement. However, the test signal frequency is at 100 kHz, and sampling 100 times per test signal period would imply a sampling frequency of 10 MHz, which is not feasible with the low-cost microcontroller contemplated for all the embodiments disclosed herein.

In the equivalent time sampling approach, the analog-to-digital converter trigger signal has a frequency which is equal to the test signal frequency plus or minus a difference frequency. The analog-to-digital converter trigger period is chosen to be one microcontroller system clock 120 period longer than the test signal frequency clock period. Thereby, the analog-to-digital converter sample advances one microcontroller clock period for each test signal period.

Without any loss of generality it shall be assumed that the first analog-to-digital converter sampling occurs exactly at the beginning of the first test signal period. In the subsequent test signal period, the second analog-to-digital converter sampling will occur at the start of the second test signal period plus one microcontroller clock period, and so on. The microcontroller 114 of the embodiment has a system clock 120 with a frequency of 16 MHz. As the test signal frequency is 100 kHz, there will have passed exactly 16 MHz/100 kHz=160 test signal periods (or 1.6 ms) until the analog-to-digital converter sampling coincides again with the beginning of a test signal period. Thereby, the analog-to-digital converter 126 has sampled one full test signal period in an equivalent way, with 160 samples taken for one full test signal period. In this embodiment, the processor unit 116 of the microcontroller 114 is configured to sample a plurality of four equivalent test signal periods, i.e. 640 samples, and to store the determined data in the microcontroller digital memory unit 118.

This step is performed for both the sensor voltage signal and the reference voltage signal and the sampled data of both signals is stored in the digital memory unit 118.

In another step 104 of the method, a difference voltage signal is obtained by subtracting the sampled reference voltage signal from the sampled sensor voltage signal.

Then, in the next step 106, the difference voltage signal is fed to a vector demodulator unit 172 including a quadrature detector. The difference voltage signal is multiplied firstly by a sine wave having a period of 160 samples, and secondly by a cosine wave having a period of 160 samples. Then, each of the results of both multiplications is integrated, and the integration results are indicative of the real part and the imaginary part of the complex impedance measurement.

In order to calculate the actual real and imaginary parts of the complex impedance of the capacitive sensor 112, there is an additional magnitude normalization and phase correction performed in an additional step of the method. This can be carried out, for instance, by multiplying the real part and the imaginary part of the complex impedance measurement with a calibration vector determined a priori, either by circuit characterization or by calibration.

Figure 3:
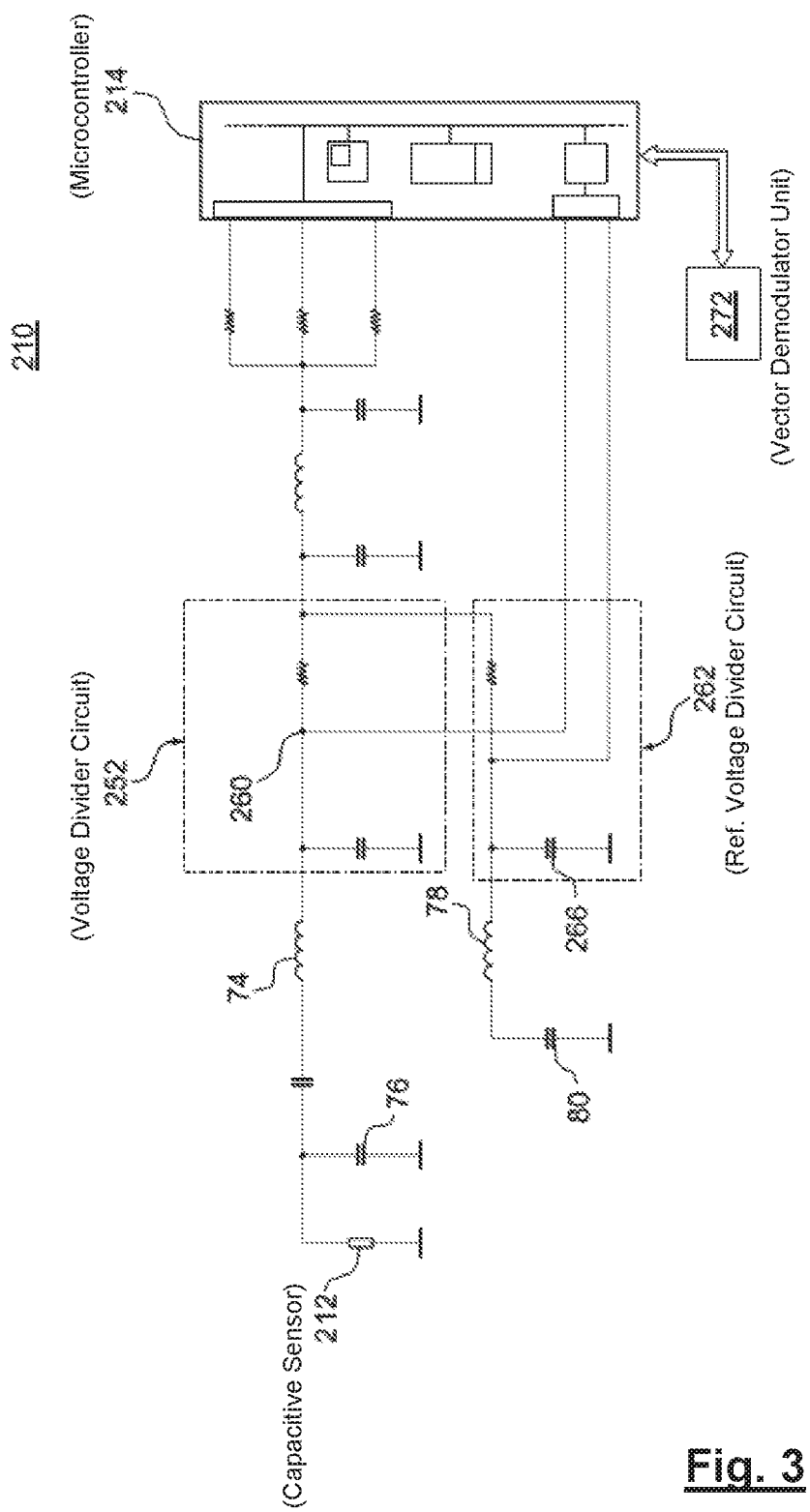
FIG. 3 shows a layout of an alternative embodiment of an impedance measurement circuit in accordance with the invention.

A layout of another embodiment of an impedance measurement circuit 210 for determining a complex impedance of a capacitive sensor 212 operated in loading mode in accordance with the invention is illustrated in FIG. 3. Only features differing from the embodiment pursuant to FIG. 1 will be described. For features of the second embodiment that are not described hereinafter, reference is made to the description of the first embodiment.

In comparison to the first embodiment (FIG. 1), the embodiment of an impedance measurement circuit 210 pursuant to FIG. 3 further comprises a radio frequency choke 74 formed as a ferrite bead and electrically connected in series between the capacitive sensor 212 and the circuit center point 260 of the sensor signal voltage divider circuit 252.

The impedance measurement circuit 210 further includes an additional EMI-protection capacitor 76 that is electrically connected in parallel to the capacitive sensor 212.

Then, the impedance measurement circuit 210 further comprises another radio frequency choke 78 that is substantially identical to the radio frequency choke 74 of the sensor signal voltage divider circuit 252, and that is electrically connected in series to an additional EMI-protection capacitor 80 that is substantially identical to the additional EMI-protection capacitor 76. The radio frequency choke 78 and the additional EMI-protection capacitor 80 are connected in parallel to the at least one capacitor 266 of the reference voltage divider circuit 262.

By employing the two radio frequency chokes 74, 78, electromagnetic interference is further suppressed. The method of measuring the impedance of the sense-only capacitive sensor 212 operated in loading mode described in context with the first embodiment is applicable without any changes.

Figure 4:
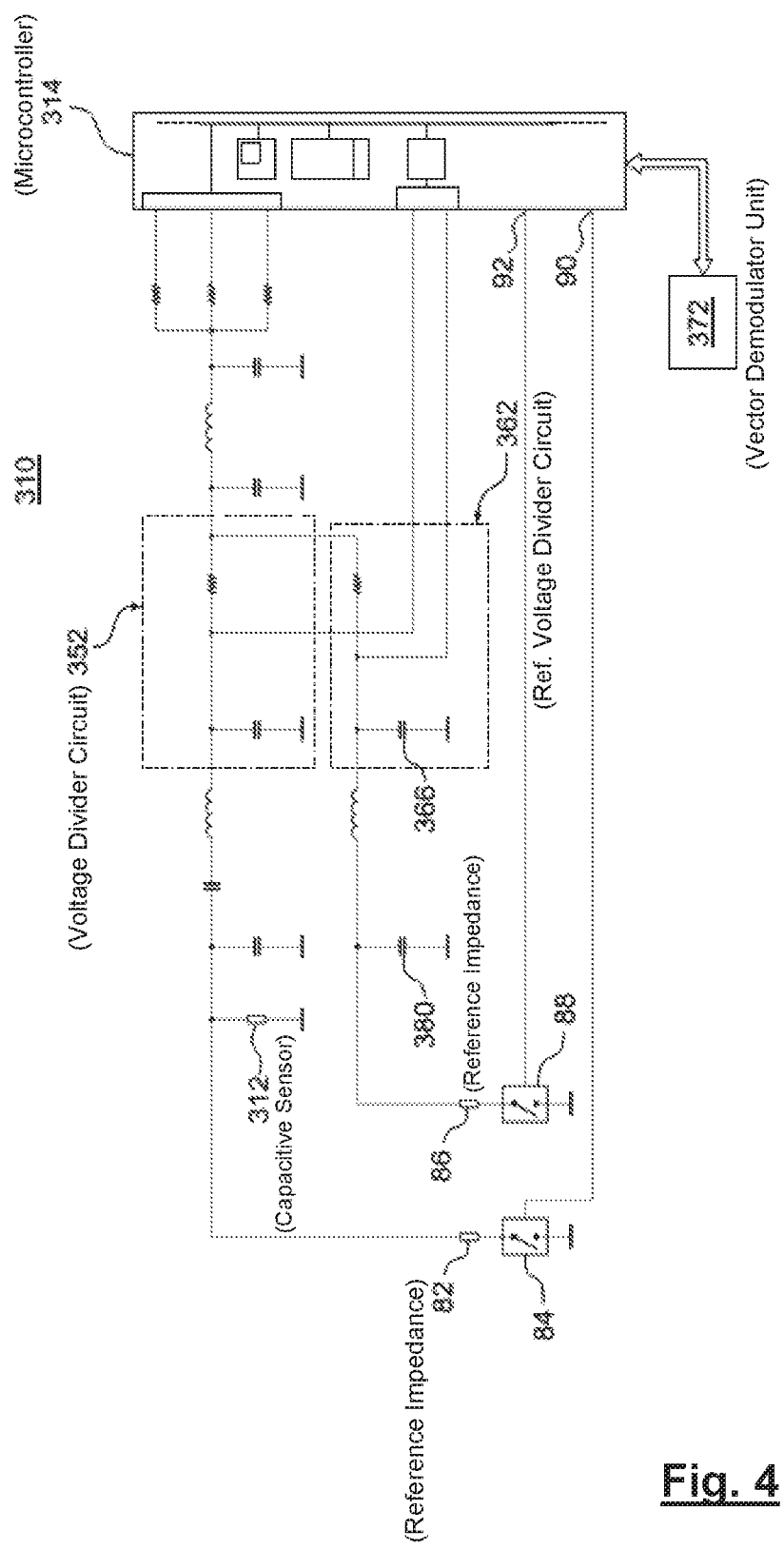
FIG. 4 shows a layout of another alternative embodiment of an impedance measurement circuit in accordance with the invention.

A layout of another alternative embodiment of an impedance measurement circuit 310 for determining a complex impedance of a capacitive sensor 312 operated in loading mode in accordance with the invention is shown in FIG. 4.

In comparison to the second embodiment of FIG. 3, the embodiment of an impedance measurement circuit 310 pursuant to FIG. 4 further comprises a reference impedance 82 whose impedance is a priori known, and which can be transferred between a state of being electrically connected in parallel to the capacitive sensor 312 and a state of being disconnected from the sensor signal voltage divider circuit 352 via a switch 84 that is remotely-controlled by an actuator port 90 of the microcontroller 314.

Also, the impedance measurement circuit 310 is equipped with another reference impedance 86 whose impedance is a priori known, and which can be transferred between a state of being electrically connected in parallel to the additional EMI-protection capacitor 380 of the reference voltage divider circuit 362 (which, at the test signal frequency, also means being connected in parallel to the capacitor 366 of the reference voltage divider circuit 362) and a state of being disconnected from the reference voltage divider circuit 362 via another remotely-controlled switch 88 that is remotely-controlled by another actuator port 92 of the microcontroller 314.

The method of measuring the impedance of the sense-only capacitive sensor 312 operated in loading mode with the embodiment of an impedance measurement circuit 310 pursuant to FIG. 4 is modified as follows:

The sinusoidal test signal is applied to the sensor signal voltage divider circuit 352 with the reference impedance 82 being electrically connected in parallel to the capacitive sensor 312, and, subsequently, with the reference impedance 82 being electrically disconnected from the sensor signal voltage divider circuit 352.

The amplitude and relative phase of a second sensor voltage signal are determined, in addition to determining amplitude and relative phase of the sensor voltage signal with the reference impedance 82 being electrically disconnected from the sensor signal voltage divider circuit 352, with the reference impedance 82 being electrically connected in parallel to the capacitive sensor 312.

The difference voltage signal is obtained by subtracting the reference voltage signal from the sensor voltage signal and, in addition, a second difference voltage signal is obtained by subtracting the reference voltage signal from the second sensor voltage signal.

The sinusoidal test signal is applied to the reference voltage divider circuit 362 with the reference impedance 86 being electrically connected in parallel to the capacitor 366 of the reference voltage divider circuit 362, and, subsequently, with the reference impedance 86 being electrically disconnected from the reference voltage divider circuit 362.

The amplitude and relative phase of a third reference voltage signal are determined, in addition to determining amplitude and relative phase of the reference voltage signal with the reference impedance 86 being electrically disconnected from the reference voltage divider circuit 362, with the reference impedance 86 being electrically connected in parallel to the capacitor 366 of the reference voltage divider circuit 362.

A third difference voltage signal is obtained by subtracting the third reference voltage signal from the sensor voltage signal.

The difference voltage signal, the second difference voltage signal and the third difference voltage signal are subsequently fed to the vector demodulator unit 372. In the vector demodulator unit 372, the various difference voltage signals are processed in the same way as described for the first embodiment of the method.

The advantage of adding the reference impedance 82 to the sensor signal voltage divider circuit 352 is that it allows the characterization of a relevant measurement path. However, for the measurement to be reliable it is required that the complex impedance of the capacitive sensor 312 is constant during the measurement. The advantage of adding the second reference impedance 86 to the reference voltage divider circuit 362 is that for the measurement to be reliable, the complex impedance of the capacitive sensor 312 does not have to be constant during the measurement. However, the measurement at the reference voltage divider circuit 362 does not characterize the relevant measurement path.

By adding reference impedances 82, 86 to the sensor signal voltage divider circuit 352 as well as to the reference voltage divider circuit 362, the advantages are combined and the downsides eliminated.

In the above disclosed embodiments of the invention three PWM outputs have been used for the sine wave generation. It should however be noted that the sine wave generation does not necessarily require three outputs. If more or less distortion is allowed for the sine wave, then any number greater or equal to one of PWM outputs can be used with appropriate phase shifts in between and appropriate resistive weighting.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A method of measuring impedance of a sense-only capacitive sensor operated in loading mode, the method comprising the following steps:

generating a plurality of synchronized output signals having a test signal frequency by at least one pulse width modulation unit, said plurality of synchronized output signals exhibiting a defined relative phase shift between each other;

combining a said plurality of synchronized output signals having a test signal frequency by summing the synchronized output signals, applying low-pass filtering to the summed output signals to generate a sinusoidal test signal of test signal frequency;

applying the sinusoidal test signal to a sensor signal voltage divider circuit comprising at least one impedance member and at least one capacitor connected in series, and a capacitive sensor having a complex impedance which at the test signal frequency is electrically connected in parallel to the at least one capacitor;

determining amplitude and relative phase, with respect to the sinusoidal test signal, of a sensor voltage signal that is indicative of the complex impedance of the capacitive sensor;

applying the sinusoidal test signal to a reference voltage divider circuit that is substantially identical to the sensor signal voltage divider circuit except for the absence of a capacitive sensor;

determining amplitude and relative phase, with respect to the sinusoidal test signal, of a reference voltage signal that is indicative of a complex impedance of the reference voltage divider circuit;

obtaining a difference voltage signal by subtracting the reference voltage signal from the sensor voltage signal; and feeding the difference voltage signal to a vector demodulator unit for obtaining a real part and an imaginary part of the complex impedance of the capacitive sensor.

2. The method as claimed in claim 1, wherein the test signal frequency lies in a range between 10 kHz and 500 kHz.

3. The method as claimed in claim 1, wherein the step of determining amplitude and relative phase of the sensor voltage signal includes converting the sensor voltage signal by a first analog-digital-converter into a sampled sensor voltage signal, and the step of determining amplitude and relative phase of the reference voltage signal includes converting the reference voltage signal by a second analog-digital-converter into a sampled reference voltage signal.

4. The method as claimed in claim 3, wherein the step of determining amplitude and relative phase of the sensor voltage signal and the step of determining amplitude and relative phase of the reference voltage signal comprise employing an equivalent time sampling method.

5. The method as claimed in claim 4, wherein the equivalent time sampling method is carried out by a microcontroller and includes employing an incremental time delay between subsequent samples that is equal to one clock period of the microcontroller.

6. The method as claimed in claim 1, further comprising a step of providing at least one radio frequency choke electrically connected in series between the capacitive sensor and the series connection of the at least one impedance member and the at least one capacitor of the sensor signal voltage divider circuit, and at least one additional capacitor that is electrically connected in parallel to the capacitive sensor, and at least one radio frequency choke that is substantially identical to the radio frequency choke of the sensor signal voltage divider circuit, and that is electrically connected in series to at least one additional capacitor that is substantially identical to the additional capacitor of the sensor signal voltage divider circuit, the at least one radio frequency choke and the at least one capacitor connected in parallel to the at least one capacitor of the reference voltage divider circuit for suppressing electromagnetic interference.

7. The method as claimed in claim 1, further comprising a step of providing a reference impedance, the impedance of which is a priori known, and a remotely-controlled switch, said remotely-controlled switch being operable to transfer said reference impedance between a state of being electrically connected in parallel to the capacitive sensor and a state of being disconnected from the sensor signal voltage divider circuit, wherein the step of applying the sinusoidal test signal to the sensor signal voltage divider circuit comprises applying the sinusoidal test signal with the reference impedance being electrically connected in parallel to the capacitive sensor, and applying the sinusoidal test signal with the reference impedance being electrically disconnected from the sensor signal voltage divider circuit, wherein the step of determining amplitude and relative phase of the sensor voltage signal comprises, in addition to determining amplitude and relative phase of the sensor voltage signal with the reference impedance being electrically disconnected from the sensor signal voltage divider circuit, determining amplitude and relative phase of a second sensor voltage signal with the reference impedance being electrically connected in parallel to the capacitive sensor, wherein the step of obtaining a difference voltage signal includes obtaining the difference voltage signal by subtracting the reference voltage signal from the sensor voltage signal and, in addition, obtaining a second difference voltage signal by subtracting the reference voltage signal from the second sensor voltage signal, and wherein the step of feeding the difference voltage signal to the vector demodulator unit is carried out subsequently for the difference voltage signal and the second difference voltage signal.

8. The method as claimed in claim 1, further comprising a step of providing a reference impedance, the impedance of which is a priori known, and a remotely-controlled switch, said remotely-controlled switch being operable to transfer said reference impedance between a state of being electrically connected in parallel to the at least one capacitor of the reference voltage divider circuit at the test signal frequency and a state of being disconnected from the reference voltage divider circuit, wherein the step of applying the sinusoidal test signal to the reference voltage divider circuit comprises applying the sinusoidal test signal with the reference impedance being electrically connected in parallel to the at least one capacitor of the reference voltage divider circuit, and applying the sinusoidal test signal to the reference voltage divider circuit with the reference impedance being electrically disconnected from the reference voltage divider circuit, wherein the step of determining amplitude and relative phase of the reference voltage signal comprises, in addition to determining amplitude and relative phase of the reference voltage signal with the reference impedance being electrically disconnected from the reference voltage divider circuit, determining amplitude and relative phase of a third reference voltage signal with the reference impedance being electrically connected in parallel to the at least one capacitor of the reference voltage divider circuit, wherein the step of obtaining a difference voltage signal includes obtaining the difference voltage signal by subtracting the reference voltage signal from the sensor voltage signal and, in addition, obtaining a third difference voltage signal by subtracting the third reference voltage signal from the sensor voltage signal, and wherein the step of feeding the difference voltage signal to the vector demodulator unit is carried out subsequently for the difference voltage signal and the third difference voltage signal.

9. An impedance measurement circuit for determining a complex impedance of a sense-only capacitive sensor operated in loading mode, comprising
- a microcontroller, including
  - a processor unit,
  - a digital memory unit,
  - a microcontroller system clock,
  - a plurality of synchronized pulse width modulation units, and
  - an analog-to-digital converter unit;
- a vector demodulator unit;
- a pulse generator unit that is configured to weight and to sum output signals of the plurality of synchronized pulse width modulation units, said output signals having one test signal frequency and said output signals exhibiting a defined relative phase shift between each other;
- a low-pass filter unit that is connected in series to an output of the pulse generator unit and that is configured to filter the summed output signals for generating a sinusoidal test signal of the test signal frequency;
- a sensor signal voltage divider circuit being connected in series to the low-pass filter unit and including at least one impedance member and at least one capacitor connected in series, wherein the at least one capacitor is connectable to the capacitive sensor having a complex impedance, the capacitive sensor in a connected state being electrically connected in parallel to the at least one capacitor at the test signal frequency, and the sensor signal voltage divider circuit being connected to a first input port of the analog-to digital converter unit; and
- a reference voltage divider circuit being connected in series to the low-pass filter unit and substantially identical to the sensor signal voltage divider circuit except for the absence of connections to the capacitive sensor, and the reference voltage divider circuit being connected to a second input port of the analog-to-digital converter unit;
- wherein the processor unit is configured to at least carry out steps of the method as claimed in claim 1.

10. The impedance measurement circuit as claimed in claim 9, wherein the analog-to-digital converter unit includes a single analog-to-digital converter and a multiplexer, wherein the multiplexer is configured, controlled by the processor unit, to switch the first input port or the second input port of the analog-to-digital converter unit to an input port of the single analog-to-digital converter.

11. The impedance measurement circuit as claimed in claim 9, further comprising
- at least one radio frequency choke electrically connected in series between the capacitive sensor and the series connection of the at least one impedance member and the at least one capacitor of the sensor signal voltage divider circuit,
- at least one additional capacitor that is electrically connected in parallel to the capacitive sensor, and
- at least another radio frequency choke that is substantially identical to the radio frequency choke of the sensor signal voltage divider circuit, and that is electrically connected in series to at least one additional capacitor that is substantially identical to the additional capacitor of the sensor signal voltage divider circuit, the at least another radio frequency choke and the at least one additional capacitor being connected in parallel to the at least one capacitor of the reference voltage divider circuit for suppressing electromagnetic interference.

12. The impedance measurement circuit as claimed in claim 9, further comprising a reference impedance, the impedance of which is a priori known, and a remotely-controlled switch, said remotely-controlled switch being operable to transfer said reference impedance between a state of being electrically connected in parallel to the capacitive sensor and a state of being disconnected from the sensor signal voltage divider circuit.

13. The impedance measurement circuit as claimed in claim 9, further comprising a reference impedance, the impedance of which is a priori known, and a remotely-controlled switch said remotely-controlled switch being operable to transfer said reference impedance between a state of being electrically connected in parallel to the at least one capacitor of the reference voltage divider circuit and a state of being disconnected from the reference voltage divider circuit.

14. A non-transitory digital memory unit comprising a software module having program code stored in the digital memory unit and that is executable by a processor unit of the microcontroller to carry out the method of claim 1.

* * * * *